(12) United States Patent
Scherer

(10) Patent No.: US 6,262,638 B1
(45) Date of Patent: Jul. 17, 2001

(54) TUNABLE AND MATCHABLE RESONATOR COIL ASSEMBLY FOR ION IMPLANTER LINEAR ACCELERATOR

(75) Inventor: Ernst F. Scherer, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/162,181

(22) Filed: Sep. 28, 1998

(51) Int. Cl.$^7$ ............................. H03H 5/02; H01J 23/06

(52) U.S. Cl. .................... 333/174; 333/175; 315/505; 250/492.21

(58) Field of Search ..................................... 333/175, 174; 315/505; 250/492.21; 334/65, 71, 74, 78, 80

(56) References Cited

U.S. PATENT DOCUMENTS

| 4,667,111 | 5/1987 | Glavish et al. | 250/492.2 |
| 5,028,894 | * 7/1991 | Speake | 333/174 |
| 5,504,341 | 4/1996 | Glavish | 250/492.21 |

FOREIGN PATENT DOCUMENTS

877351 * 12/1942 (FR) ........................................ 334/74

OTHER PUBLICATIONS

"Fine Tuning Arrangements," Electronic Engineering, p. 298, Jul. 1953.*

* cited by examiner

Primary Examiner—Justin P. Bettendorf
(74) Attorney, Agent, or Firm—John A. Kastelic

(57) ABSTRACT

A resonator circuit capable of resonating at a predetermined frequency is provided. The resonator circuit comprises a fixed position coil inductor (62) having a longitudinal axis (92) and a capacitor (88, 82) electrically connected in parallel with each other to form a resonator (60), so that respective first and second ends of the inductor and the capacitor are electrically coupled together at a high-voltage end (64) and a low-voltage end (66) of the resonator (60). A radio frequency (RF) input coupling (70) is coupled directly to the inductor (62) at the low-voltage end (66) of the resonator. A high-voltage electrode (72) is coupled to the high-voltage end (64) of the resonator. A first resonator tuning mechanism is provided for varying the inductance of the inductor, comprising a plunger (90) movable within the coil of the inductor (62) along the longitudinal axis (92). A second resonator tuning mechanism is provided for varying the capacitance of the capacitor (88, 82). The first tuning mechanism provides fine tuning of the resonator by means of varying the inductance of the inductor (62), and the second tuning mechanism provides coarse or initial tuning of the resonator by means of varying the capacitance of the capacitor (88, 82).

23 Claims, 4 Drawing Sheets

TUNABLE AND MATCHABLE RESONATOR COIL ASSEMBLY FOR ION IMPLANTER LINEAR ACCELERATOR

FIELD OF THE INVENTION

The present invention relates generally to high-energy ion implantation systems and more particularly to a method and device for tuning and matching a resonator coil assembly for use in such systems.

BACKGROUND OF THE INVENTION

Ion implantation has become the technology preferred by industry to dope semiconductors with impurities in the large-scale manufacture of integrated circuits. High-energy ion implanters are used for deep implants into a substrate. Such deep implants are required to create, for example, retrograde wells. Eaton GSD/HE and GSD/VHE ion implanters are examples of such high-energy implanters. These implanters can provide ion beams at energy levels up to 5 MeV (million electron volts). U.S. Pat. No. 4,667,111, assigned to the assignee of the present invention, Eaton Corporation, and describing such an high-energy ion implanter, is incorporated by reference herein as if fully set forth.

A block diagram of a typical high-energy ion implanter 10 is shown in FIG. 1. The implanter 10 comprises three sections or subsystems: a terminal 12 including an ion source 14 powered by a high-voltage supply 16 to produce an ion beam 17 of desired current and energy; an end station 18 which contains a rotating disc 20 carrying wafers W to be implanted by the ion beam; and a beamline assembly 22, located between the terminal 12 and the end station 18, which contains a mass analysis magnet 24 and a radio frequency (RF) linear accelerator (linac) 26. The beamline assembly 22 conditions the ion beam output by the terminal 12 and directs the conditioned beam toward the target wafer W. A final energy magnet (not shown in FIG. 1) may be positioned between the linac 26 and the rotating disc.

The mass analysis magnet 24 functions to pass only ions of an appropriate charge-to-mass ratio to the linac. The mass analysis magnet is required because the ion source 14, in addition to generating ions of appropriate charge-to-mass ratio, also generates ions of greater or lesser charge-to-mass ratio than that desired. Ions having inappropriate charge-to-mass ratios are not suitable for implantation into the wafers W.

The ion beam 17 passes through the mass analysis magnet 24 and enters the RF linac 26 which imparts additional energy to the ion beam passing therethrough. The RF linac produces particle accelerating fields which vary periodically with time, the phase of which may be adjusted to accommodate different atomic number particles as well as particles having different speeds. The RF linac 26 comprises a series of resonator modules 30a through 30n, each of which functions to further accelerate ions beyond the energies they achieve from a previous module.

FIG. 2 shows a known type of resonator module 30, comprising a large inductive coil L contained within a resonator cavity housing 31 (i.e., a "tank" circuit). A radio frequency (RF) signal is capacitively coupled to a high-voltage end of the inductor L via capacitor $C_C$. An accelerating electrode 32 is directly coupled to the high-voltage end of the inductor L. Each accelerating electrode 32 is mounted between two grounded electrodes 34 and 36, and separated by gaps 38 and 40, respectively. $C_S$ represents the stray capacitance of the high-voltage acceleration electrode 32 to ground. $R_L$ represents the losses associated with the resonant circuit comprising L and $C_S$ in a series loop (see FIG. 3).

Values for $C_S$ and L are chosen for the circuit to achieve a state of resonance so that a sinusoidal voltage of large magnitude may be achieved at the location of the accelerating electrode 32. The accelerating electrode 32 and the ground electrodes operate in a known "push-pull" manner to accelerate the ion beam passing therethrough, which has been "bunched" into "packets". During the negative half cycle of the RF sinusoidal electrode voltage, a positively charged ion packet is accelerated (pulled by the accelerating electrode 32) from the first grounded electrode 34 across gap 38. At the transition point in the sinusoidal cycle, wherein the electrode 32 is neutral, the packet drifts through the electrode 32 (also referred to as a "drift tube") and is not accelerated.

During the positive half cycle of the RF sinusoidal electrode voltage, positively charged ion packets are further accelerated (pushed by the accelerating electrode 32) toward the second grounded electrode 36 across gap 40. This push-pull acceleration mechanism is repeated at subsequent resonator modules having accelerating electrodes that also oscillate at a high-voltage radio frequency, thereby further accelerating the ion beam packets by adding energy thereto. The RF phase of successive accelerating electrodes in the modules is independently adjusted to insure that each packet of ions arrives at the appropriate gap at a time in the RF cycle that will achieve maximum acceleration.

FIG. 3 shows the equivalent circuit of the resonator module 30 of FIG. 2. The time dependent input/output variables are voltage v(t) and current i(t). By taking advantage of the duality of time and frequency domain representation (the Fourier transform), time may be eliminated as a variable and replaced with $\omega$, the radian frequency. In the harmonic steady state of resonance, v(t) and i(t) at frequency f are linearly related by the complex impedance $Z(\omega)$, such that $V=Z(\omega)I$, where $v(t)=V \sin \omega t$ and $\omega=2\pi f$.

In the circuit of FIG. 3, the complex impedance Z of capacitor $C_S$ is proportional to 1/f, with I leading V by 90°; the complex impedance Z of inductor L is proportional to f, with I lagging V by 90°; and the resistive losses $R_L$ are generally independent of frequency, with I and V in-phase with each other. At resonance, maximum voltage is achieved at the accelerating electrode 32 for a given input RF signal, the currents in $C_S$ and L cancel because they are 180° out of phase, and all power in the circuit is dissipated through resistor $R_L$. To attain a resonant state, $\omega=2\pi f=(LC)^{-\frac{1}{2}}$. For example, in the Eaton GSD series, $\omega=13.56$ megahertz (MHz).

To maintain a state of resonance, the product of $L \times C_S$ must remain constant. The quality factor Q of the resonant circuit also depends upon the ratio of $R_L/X$, where $X=\omega L$, or the ratio of stored energy per cycle over dissipated energy per cycle. Accordingly, drifts in $C_S$ and changes in L during operation may be accommodated by altering only one of these factors, in this case L, to "tune" the resonator circuit. Also, in order to obtain maximum power out of the resonator module 30, the impedance of the resonator circuit must "match" that of the RF input source to minimize reflection of the input signal from the circuit back into the source.

FIG. 4 shows a prior art resonator module and the mechanisms provided for matching and tuning of the resonator circuit. The tuning mechanism comprises a servomotor (not shown) which moves a stem 44 of inductor L in and out of resonator cavity housing 31 in the directions shown by arrow 46. By moving (stretching or compressing) the inductive coil L along axis 47, the inductance value of the inductor can be altered. A collar 48 is provided at the high-current (up to 200 amps), low-voltage end of the inductor, through which the inductor stem slides in and out. However, this tuning mechanism provided in FIG. 4 (i) requires significant power to stretch/compress the relatively stiff inductor; (ii) causes work hardening of the inductor which results in non-uniform inductance along the length of the coil; and (iii) requires a low-impedance, high-current collar which is subject to wear and potential breakdown over time.

The prior art matching mechanism shown in FIG. 4 is provided by the capacitor $C_C$ which provides the capacitive coupling of the RF signal input from connector 50 to the inductor L. As shown more clearly in FIG. 5, the capacitor $C_C$ comprises a C-shaped element 52 having adjustable extensions 54 attached thereto by screws 56. The capacitor $C_C$ functions as a transformer to match the impedance of the RF source (typically 50 Ω) with the impedance of the circuit $R_L$ (typically 1 MΩ). The adjustable extensions 54 may be extended or retracted to adjust the capacitance of capacitor $C_C$. However, this matching mechanism provided in FIGS. 4 and 5 requires that the RF coupling to the inductor L be made at the high-voltage end of the inductor, thereby increasing the risk of arcing between the electrically grounded capacitor $C_C$ and the high-voltage inductor stem 44.

Accordingly, it is an object of the present invention to provide a resonator coil assembly having improved mechanisms for tuning and matching that overcome the deficiencies in the prior art. It is a further object to provide such a coil assembly for use in an ion implanter. It is yet a further object to provide methods and devices for tuning and matching such a coil assembly.

SUMMARY OF THE INVENTION

A resonator circuit capable of resonating at a predetermined frequency is provided. The resonator circuit comprises a fixed position coil inductor having a longitudinal axis and a capacitor electrically connected in parallel with each other to form a resonator, so that respective first and second ends of the inductor and the capacitor are electrically coupled together at a high-voltage end and a low-voltage end of the resonator. A radio frequency (RF) input coupling is coupled directly to the inductor at the low-voltage end of the resonator. A high-voltage electrode is coupled to the high-voltage end of the resonator. A first resonator tuning mechanism is provided for varying the inductance of the inductor, comprising a plunger movable within the coil of the inductor along the longitudinal axis. A second resonator tuning mechanism is provided for varying the capacitance of the capacitor. The first tuning mechanism provides fine tuning of the resonator by means of varying the inductance of the inductor, and the second tuning mechanism provides coarse or initial tuning of the resonator by means of varying the capacitance of the capacitor.

DETAILED DESCRIPTION OF A PREFERRED EMBODIMENT OF THE INVENTION

Figure 1:
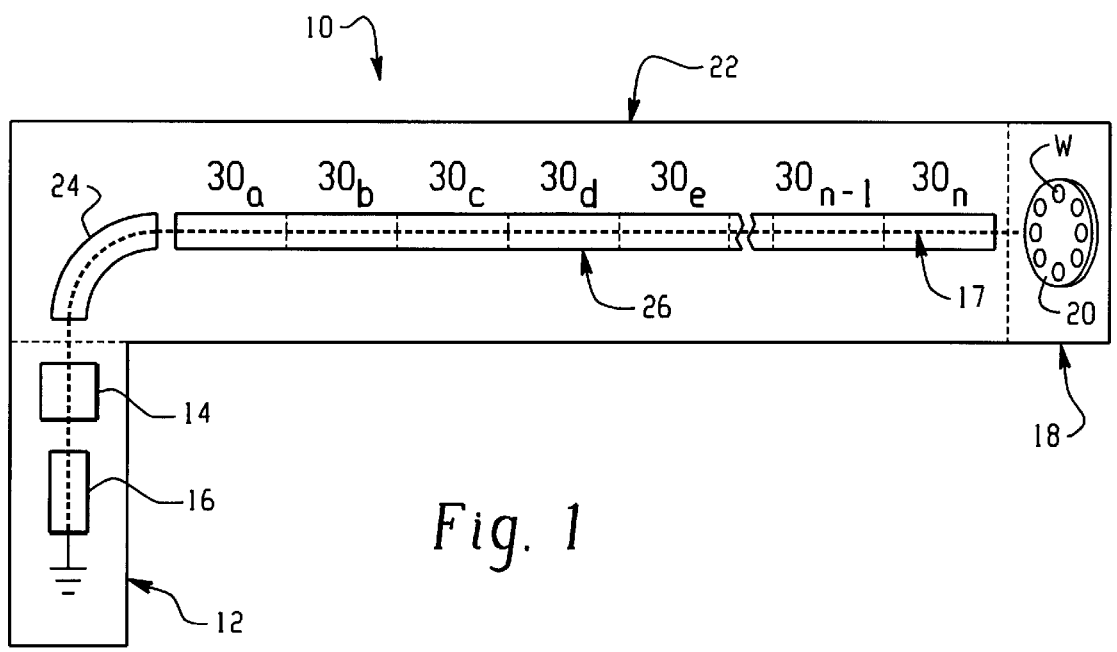
FIG. 1 is a schematic block diagram of an ion implanter having a linear accelerator into which the tunable and matchable resonator coil assembly of the present invention may be incorporated.
Figure 2:
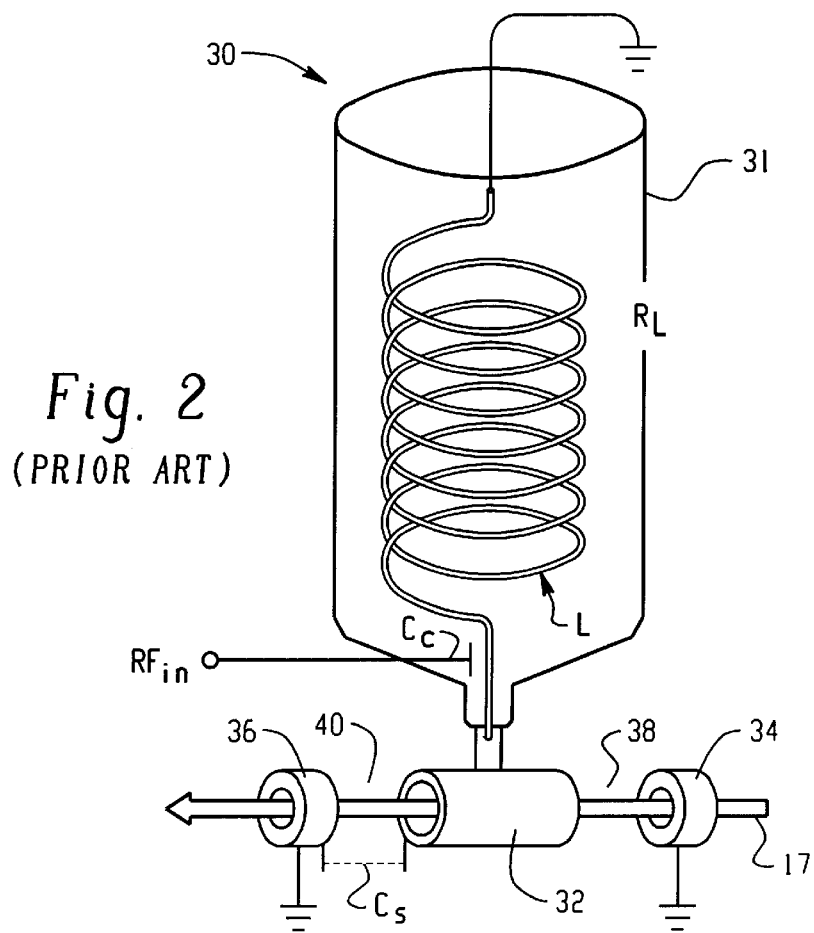
FIG. 2 is shows a prior art resonator coil assembly used in an ion implanter such as that of FIG. 1.
Figure 3:
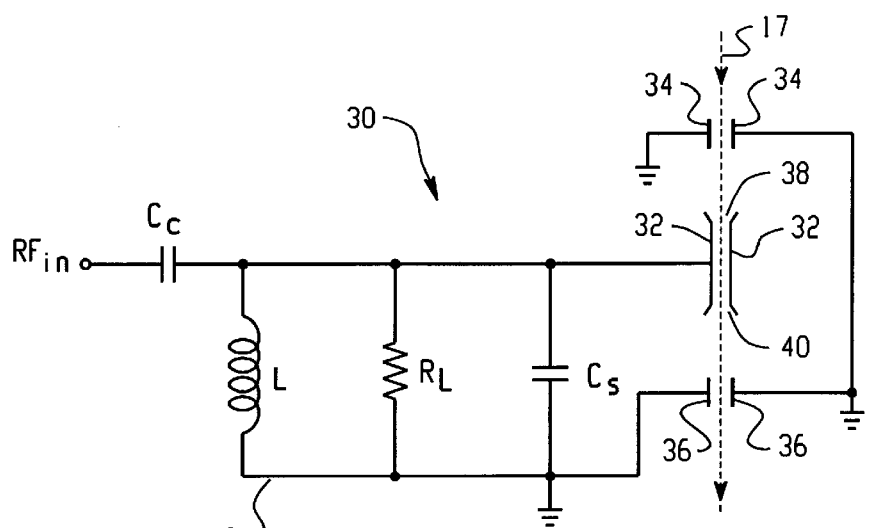
FIG. 3 is a schematic diagram of the prior art resonator coil assembly of FIG. 2.
Figure 4:
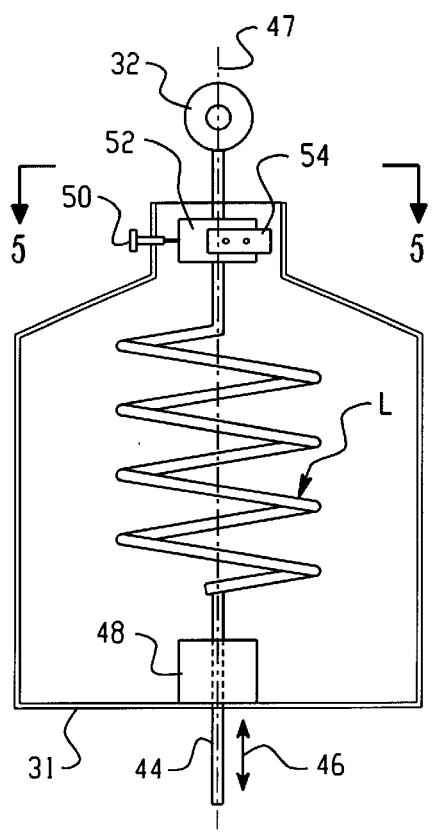
FIG. 4 is a cross sectional view of a prior art resonator coil assembly of the type shown in FIG. 2, further including known resonator tuning and impedance matching mechanisms.
Figure 5:
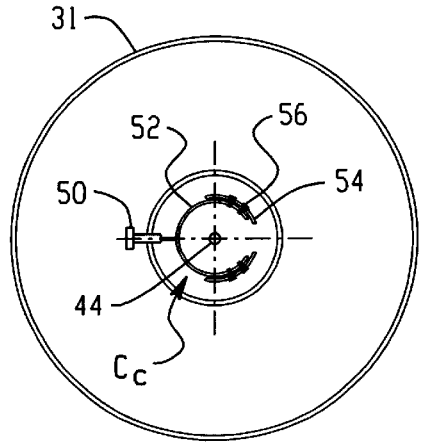
FIG. 5 is a plan view of the resonator coil assembly of FIG. 4, taken along the lines 5—5 of FIG. 4.
Figure 6:
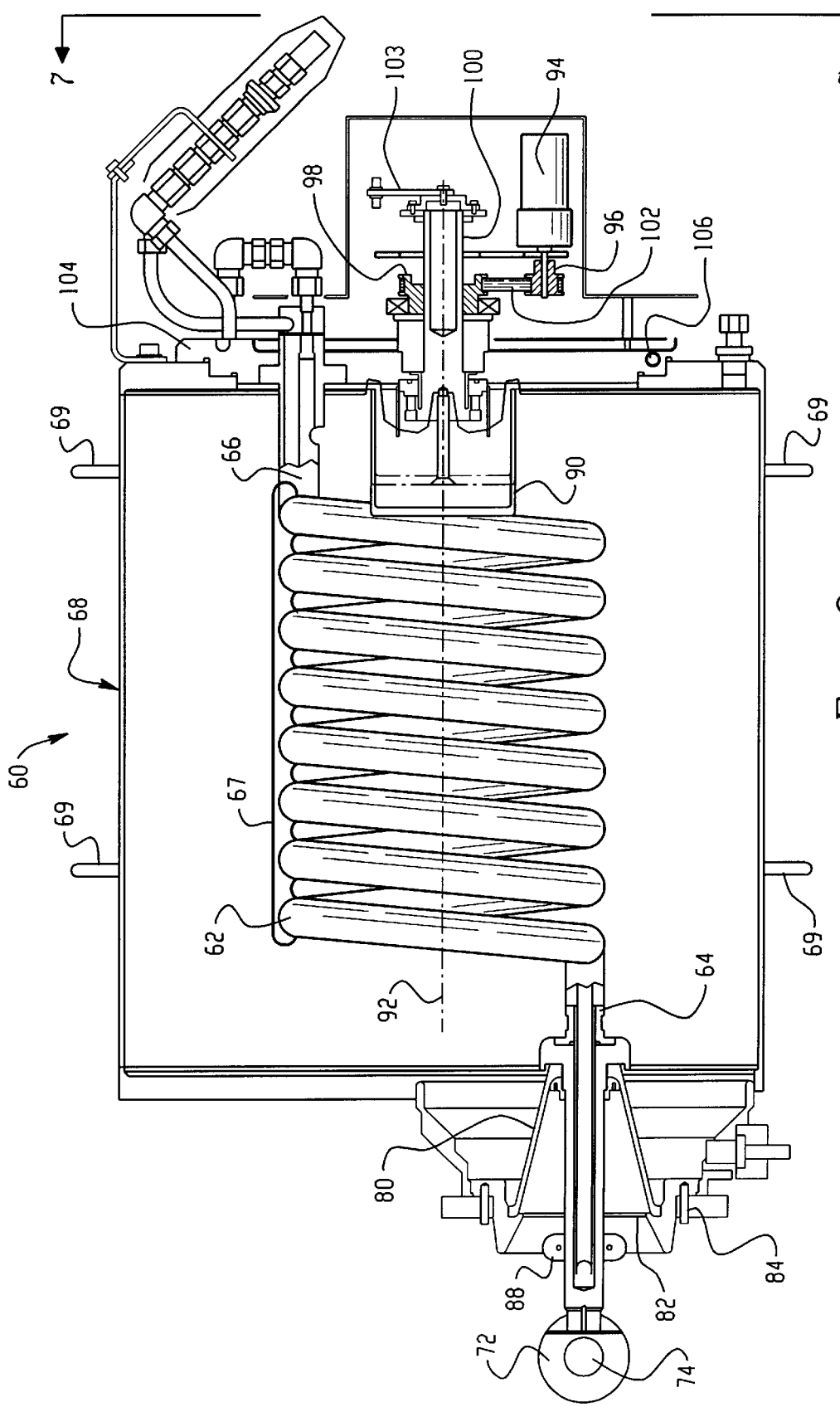
FIG. 6 is a cross sectional view of a resonator coil assembly constructed according to the principles of the present invention, incorporating the improved resonator tuning and impedance matching mechanisms.

Referring now to FIG. 6, an improved resonator coil assembly or resonator 60 is provided. The coil assembly or resonator 60 is intended for use as a replacement for the resonator module (30a through 30n) in the ion implanter 10 of FIG. 1, although applications in other types of linear accelerators are also contemplated.

As shown in FIG. 6, the resonator comprises an inductor 62 formed by a coiled hollow copper tube. As explained further below, the coil may be internally water cooled to dissipate heat generated by current flowing therethrough. The high-voltage end of the coiled tube terminates in a first coil stem 64 and the low-voltage end of the coiled tube terminates in a second coil stem 66. A spacer 67 snaps into place over the individual coil loops of the inductor 62 to maintain the distance between coil loops (and hence the inductance of the coil), and to provide mechanical stability for the inductor. The coil resides in a cylindrical housing 68, in this case made of aluminum, which is electrically grounded during operation. Handles 69 are provided for removing and installing the resonator 60 from and into the system 10.

An RF input coupling 70 (see FIGS. 7 and 8) is provided to input an RF signal into the low-voltage end of the inductor 62. A cylindrical high-voltage electrode or drift tube 72 is attached to the high-voltage end of the inductor, at the end of the first coil stem 64. The drift tube 72 is fabricated of aluminum, and forms a passage 74 through which may pass an ion beam to be accelerated.

Figure 8:
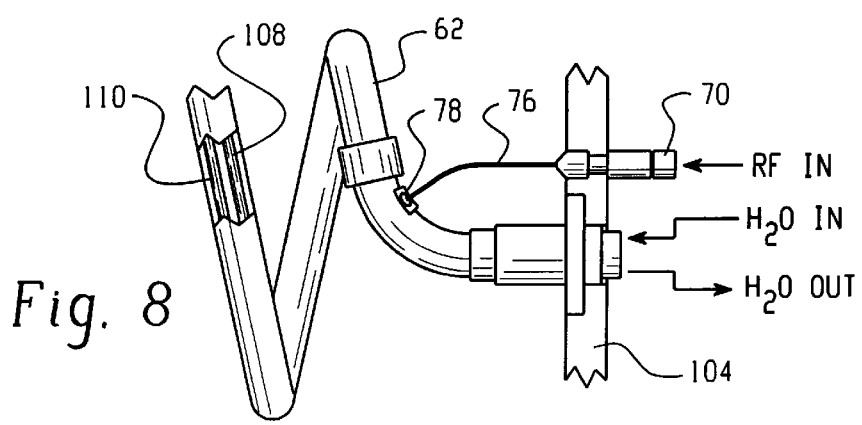
FIG. 8 is a partial cross-sectional fragmentary view of the impedance matching mechanism of the resonator coil assembly of FIG. 6.

As shown in FIG. 8, the RF coupling 70 is connected to the inductor coil 62 by means of electrical lead 76 and connector pad 78. The position of the lead 76 on the pad is determined to match the impedance of the resonator circuit with that of the RF input source to minimize reflection of the input signal from the circuit back into the source. The position is made variable to accommodate manufacturing tolerances in the coil. Once the correct position is determined, the lead 76 is soldered into a fixed position on the pad 78. By directly coupling the RF signal to the inductor coil at the low-voltage end of the coil, the need for capacitive coupling as is shown in the prior art resonator of FIGS. 2–5 is eliminated. As such, the risk of current arcing is reduced at the capacitive coupling location near the high-voltage end of the inductor coil.

The resonator 60 is designed to resonate at the frequency of 13.56 megahertz (MHz). At resonance, a voltage on the order of 80,000 volts (80 KV) is generated by the resonator at the accelerator electrode 72. As such, a ceramic insulating cone 80 extends from the grounded resonator housing toward the electrode to prevent arcing between the housing and the electrode 72 or the high-voltage coil stem 64. An annular metal flange 82 is attached to the electrically grounded housing by fasteners 84 to secure the position of the insulating cone 80.

The mechanism for tuning the resonator 60 is provided by a metallic split ring clamp 88 located on the high-voltage stem 64 of the resonator coil, and a plunger 90 which is adapted to move in and out of the coil along its central longitudinal axis 92. As further explained below, the ring clamp 88 functions as a coarse or initial tuning mechanism for the resonator 60 and the plunger 90 functions as fine tuning mechanism. Together, the ring clamp and the plunger provide an effective tuning mechanism for the resonator that permits the coil 62 to remain in a fixed position while maintaining a state of resonance.

The split ring clamp 88 is positioned over the stem 64. The position of the split ring clamp over the stem is adjustable along the length of the stem, in a direction parallel to the axis 92 of the coil 62. The ring clamp 88 and the annular metal flange 82 form a capacitor, with air in the space therebetween acting as the dielectric. As the ring is moved toward the electrode 72, the total stray capacitance $C_S$ of the resonator (see FIG. 2) decreases, thereby increasing the resonant frequency of the resonator 60. Conversely, as the ring is moved away from the electrode 72, the capacitance of the resonator increases, thereby decreasing the resonant frequency of the resonator 60.

During coarse or initial tuning of the resonator, the split ring is positioned to initially align the resonance frequency close to its desired value with the plunger mid-way between its extreme fine tuning positions. The position of the split ring 88 is then secured on the coil stem 64 and remains fixed during operation. This coarse tuning mechanism minimizes the range that the plunger must move during operation. Minimizing this range is important to minimize losses that would otherwise be caused by excessive penetration into the coil by the plunger.

The plunger 90 is constructed of an aluminum or copper closed end cylinder (e.g., a copper or aluminum cap). The plunger 90 shown in FIG. 6 is adapted to move along axis 92 into and out of the cylindrical space formed by the interior of the coil 62. Movement of the plunger along this axis changes the inductance of the inductor by changing the amount of flux through the coil 62. Both extreme fine tuning positions are shown in FIG. 6, with the most immersed position shown in solid lines and the most withdrawn position shown in phantom.

A servomotor 94 functions to bidirectionally move the plunger along axis 92. A pulley 96 on the servomotor shaft is connected to a pulley 98 on the plunger shaft 100 via belt 102. Threads on the inside of the plunger shaft pulley 98 mate with threads on the outside of the plunger shaft 100 to convert rotational motion of the pulley 98 to linear movement of the shaft 100 along axis 92. The tuning servomotor 94 is part of a tuning control loop (not shown) that receives an error signal from the resonator phase control circuit to correct for drift in the resonance frequency of the resonator, in much the same manner as the coil stretching/compressing servomotor functioned in the prior art.

A linear position encoder 101 (see FIG. 7) may be provided to provide feedback for the position of the plunger 90 within the coil 62. A shaft of the linear position encoder 101 is attached to the plunger shaft 100 by means of lever 103. The linear position encoder provides an output signal that used as in input into the tuning control loop.

The low-voltage, high-current coil stem 66 and the plunger shaft 100 pass through a generally circular shaped aluminum end plate 104 which closes one end of the aluminum cylindrical housing 68. Because of the high-current that passes through the coil at this end, heat is generated during operation of the resonator. As such, water cooling means are provided in the present invention for cooling the resonator. Specifically, water cooling passages are provided in the end plate 104, the plunger 90, and the coil 62, as further explained below.

Figure 7:
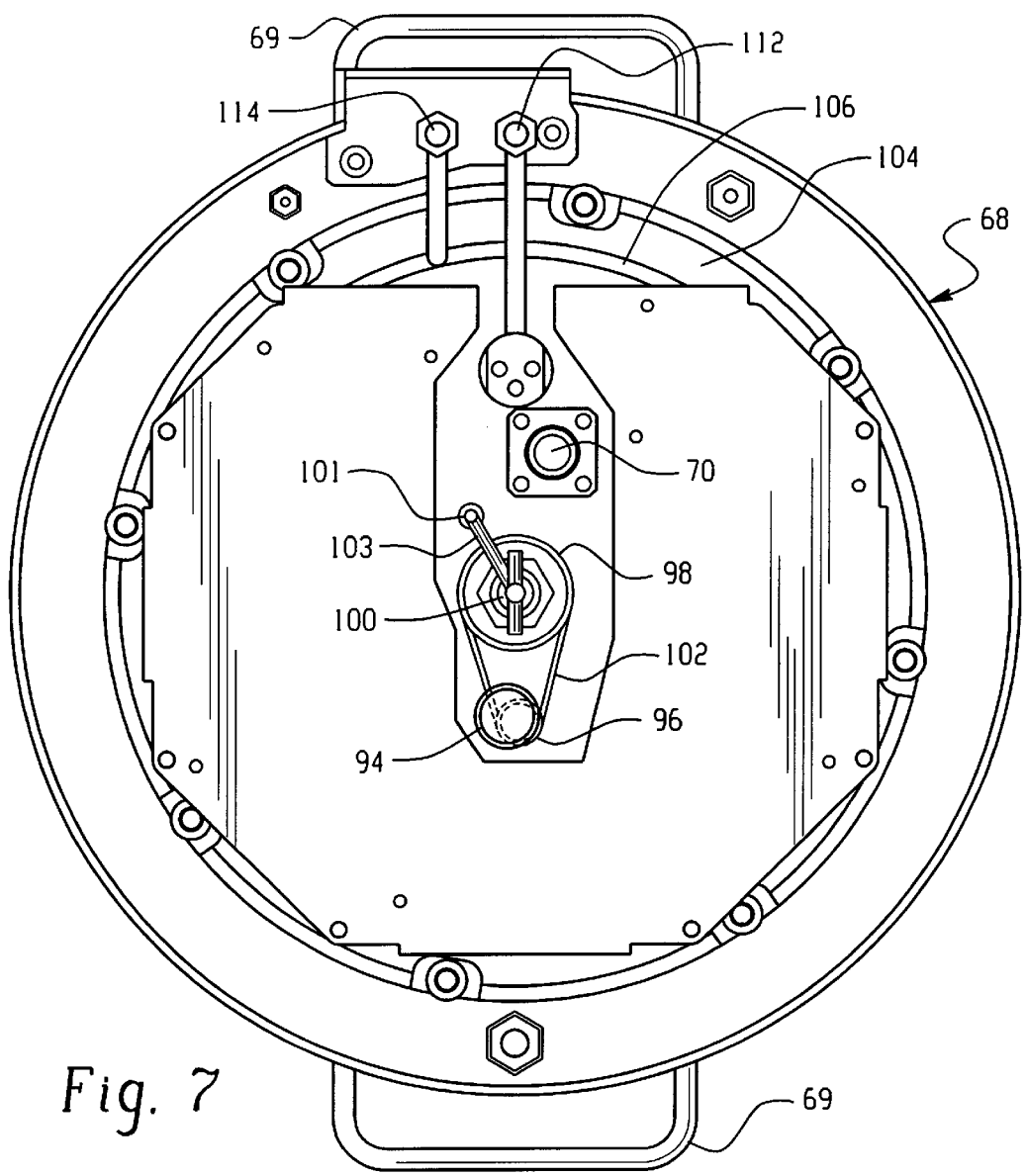
FIG. 7 is an end view of the resonator coil assembly of FIG. 6, taken along the lines 7—7.

A generally circular tubular passage 106 is provided in the endplate, running generally about the circumference thereof (see FIG. 6). Also, as shown in the cutaway portion of the coil 62 in FIG. 8, a water inlet tube 108 and a water outlet tube 110 are provided within the coil. Similar inlet and outlet tubes may be provided within the plunger shaft 100 and the plunger 90. As shown in FIG. 7, a water inlet 112 may be provided for introducing water into the inlet tube 108 of the coil, through the length of the coil, and back through the water outlet tube 110. From there, the water may be introduced into the endplate tubular passage 106, around the circumference of the end plate, and out through a water outlet 114. The plunger shaft and plunger inlet and outlet tubes may be incorporated in series with the endplate and the coil into this cooling loop so that only a single water inlet 112 and a single water outlet 114 need be provided.

Accordingly, a preferred embodiment of an improved tunable and matchable resonator for an ion implanter linac has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A resonator circuit capable of resonating at a predetermined frequency, comprising:

(i) an inductor (62) and a capacitor (88, 82) electrically connected in parallel with each other to form a resonator (60), so that respective first and second ends of said inductor and said capacitor are electrically coupled together at a high-voltage end (64) and a low-voltage end (66) of the resonator (60);

(ii) a radio frequency (RF) input coupling (70) coupled directly to said inductor (62) near said low-voltage end (66) of said resonator; and (iii) a high-voltage electrode (72) coupled to said high-voltage end (64) of said resonator.

2. The resonator circuit of claim 1, further comprising a connector pad (78) portion of said inductor (62) located at the low-voltage end (66) of the resonator (60), wherein the position of the RF input coupling (70) on the connector pad portion of the inductor is selected to match the impedance of the resonator with that of an RF source providing an RF signal to the RF input coupling.

3. The resonator of claim 2, wherein the position of the RF input coupling (70) on the connector pad (78) portion of the inductor is made manually variable to accommodate manufacturing tolerances in said inductor.

4. The resonator of claim 3, wherein said inductor is a hollow tubular coil.

5. The resonator of claim 4, wherein said hollow tubular coil is water cooled.

6. The resonator of claim 5, wherein said hollow tubular coil is provided with a spacer (67) element to maintain a predetermined distance between coil loops.

7. The resonator of claim 1, wherein said high-voltage electrode (72) includes a passage (74) through which may pass an ion beam to be accelerated.

8. A resonator circuit capable of resonating at a predetermined frequency, comprising:
(i) a fixed position coil inductor (62) having a longitudinal axis (92) and a capacitor (88, 82) electrically connected in parallel with each other to form a resonator (60), so that respective first and second ends of said inductor and said capacitor are electrically coupled together at a high-voltage end (64) and a low-voltage end (66) of the resonator (60);
(ii) a radio frequency (RF) input coupling (70) coupled to said inductor (62);
(iii) a high-voltage electrode (72) coupled to said high-voltage end (64) of said resonator;
(iv) a first resonator tuning mechanism for varying the inductance of said inductor, comprising a plunger (90) movable within the coil of said inductor (62) along said longitudinal axis (92); and
(iv) a second resonator tuning mechanism for varying the capacitance of said capacitor (88, 82);
wherein said first tuning mechanism provides fine tuning of the resonator circuit by means of varying the inductance of said inductor (62), and said second tuning mechanism provides coarse tuning of the resonator circuit by means of varying the capacitance of said capacitor (88, 82).

9. The resonator circuit of claim 8, wherein said second resonator tuning mechanism is provided by the capacitor (88, 82) being comprised of (i) a metallic element (88) connected to one end of said coil inductor (62), and (ii) a portion (82) of a coil housing (68), the position of said metallic element (88) being movable with respect to said housing portion (82) to vary the capacitance of said capacitor (88, 82).

10. The resonator circuit of claim 9, wherein said metallic element is connected to said high-voltage end (64) of said resonator, and said housing portion (82) is electrically grounded, and wherein said metallic element (88) is movable along said axis (92).

11. A resonator circuit capable of resonating at a predetermined frequency, comprising:
(i) a fixed position coil inductor (62) having a longitudinal axis (92) and a capacitor (88, 82) electrically connected in parallel with each other to form a resonator (60), so that respective first and second ends of said inductor and said capacitor are electrically coupled together at a high-voltage end (64) and a low-voltage end (66) of the resonator (60);
(ii) a radio frequency (RF) input coupling (70) coupled directly to said inductor (62) near said low-voltage end (66) of said resonator; and
(iii) a high-voltage electrode (72) coupled to said high-voltage end (64) of said resonator; and
(iv) a first resonator tuning mechanism for varying the inductance of said inductor, comprising a plunger (90) movable within the coil of said inductor (62) along said longitudinal axis (92).

12. The resonator of claim 11, wherein said high-voltage electrode (72) includes a passage (74) through which may pass an ion beam to be accelerated.

13. The resonator of claim 11, wherein said inductor is a hollow tubular coil.

14. The resonator of claim 13, wherein said hollow tubular coil is water cooled.

15. The resonator of claim 11, wherein said fixed position coil inductor (62) is provided with a spacer (67) element to maintain a predetermined distance between coil loops.

16. The resonator circuit of claim 11, further comprising a tuning servomotor for bidirectionally moving said plunger (90) along said longitudinal axis (92).

17. The resonator circuit of claim 16, further comprising a linear position encoder 101 to provide feedback for a position of said plunger (90) along said longitudinal axis (92).

18. The resonator of claim 11, further comprising a connector pad (78) portion of said inductor (62) located at the low-voltage end (66) of the resonator (60), wherein the position of the RF input coupling (70) on the connector pad portion of the inductor is selected to match the impedance of the resonator with that of an RF source providing an RF signal to the RF input coupling.

19. The resonator of claim 18, wherein the position of the RF input coupling (70) on the connector pad (78) portion of the inductor is made manually variable to accommodate manufacturing tolerances in said inductor.

20. The resonator circuit of claim 11, further comprising a second resonator tuning mechanism for varying the capacitance of said capacitor (88, 82), wherein said first tuning mechanism provides fine tuning of the resonator circuit by means of varying the inductance of said inductor (62), and said second tuning mechanism provides coarse tuning of the resonator circuit by means of varying the capacitance of said capacitor (88, 82).

21. The resonator circuit of claim 20, wherein said second resonator tuning mechanism is provided by the capacitor (88, 82) being comprised of (i) a metallic element (88) connected to one end of said coil inductor (62), and (ii) a portion (82) of a coil housing (68), the position of said metallic element (88) being movable with respect to said housing portion (82) to vary the capacitance of said capacitor (88, 82).

22. The resonator circuit of claim 21, wherein said metallic element is connected to said high-voltage end (64) of said resonator, and said housing portion (82) is electrically grounded, and wherein said metallic element (88) is movable along said axis (92).

23. A resonator circuit capable of resonating at a predetermined radio frequency (RF), comprising:
(i) a fixed position coil inductor (62) having a longitudinal axis (92) and a capacitor (88, 82) electrically connected in parallel with each other to form a resonator (60), so that respective first and second ends of said inductor and said capacitor are electrically coupled together at a high-voltage end (64) and a low-voltage end (66) of the resonator (60), said fixed position coil inductor (62) being provided with a spacer (67) element to maintain a predetermined distance between coil loops;
(ii) a radio frequency (RF) input coupling (70) coupled to said inductor (62);
(iii) a high-voltage electrode (72) coupled to said high-voltage end (64) of said resonator for accelerating an ion beam; and
(iv) a first resonator tuning mechanism for varying the inductance of said inductor, comprising a plunger (90) movable within the coil of said fixed position coil inductor (62) along said longitudinal axis (92).

* * * * *